(12) United States Patent
Stanley et al.

(10) Patent No.: US 9,769,929 B1
(45) Date of Patent: Sep. 19, 2017

(54) INTERCONNECT STRUCTURES FOR ELECTRONIC DEVICES WITH COMPONENT ARRAYS

(71) Applicant: Apple Inc., Cupertino, CA (US)

(72) Inventors: Craig M. Stanley, Campbell, CA (US); Phillip Michael Hobson, Menlo Park, CA (US); Nathan P. Bosscher, Campbell, CA (US); John J. Baker, Cupertino, CA (US); Brad G. Boozer, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 101 days.

(21) Appl. No.: 14/720,248

(22) Filed: May 22, 2015

Related U.S. Application Data

(60) Provisional application No. 62/057,746, filed on Sep. 30, 2014.

(51) Int. Cl.
*H05K 7/14* (2006.01)
*H05K 1/11* (2006.01)
(Continued)

(52) U.S. Cl.
CPC ............ *H05K 1/189* (2013.01); *H05K 1/028* (2013.01); *H05K 1/111* (2013.01); *H05K 1/181* (2013.01)

(58) Field of Classification Search
CPC .... G06F 1/1652; G06F 1/1635; G06F 3/0416; G06F 1/16; G06F 1/1647; G06F 1/1686; G06F 3/147; H05K 1/028; H05K 3/0014; H05K 1/0274; H05K 1/0278; H05K 2201/09027; H05K 2201/09036; H05K 2201/09063; H05K 2201/09218; H05K 5/0017; H05K 5/0217; H05K 5/03; H05K 1/189; H05K 1/111; H05K 1/181; H01M 2/021; H01M 2/1066; B32B 2457/20; G06K 19/077; H01G 11/78; H04M 1/0249; H04M 1/0264; H04M 1/0266; H04M 1/0277; H04M 2250/20; H04N 2005/4428; H04N 5/2252; H04N 5/2254; H04N 5/64; H04R 31/006
See application file for complete search history.

(56) References Cited

U.S. PATENT DOCUMENTS

| | | | | |
|---|---|---|---|---|
| 4,596,454 A | * | 6/1986 | Kawai | .................... G03B 17/14 396/532 |
| H1991 H | * | 9/2001 | Bolen et al. | .......... B60R 16/027 439/164 |

(Continued)

*Primary Examiner* — James Wu
*Assistant Examiner* — Michael Matey
(74) *Attorney, Agent, or Firm* — Kilpatrick Townsend & Stockton LLP

(57) ABSTRACT

An array of electrical components may be mounted in openings in an electronic device housing. The housing may have a cylindrical shape or other curved shape. A support structure such as a hollow cylindrical tube may be mounted within the interior of the housing. The electrical components may have terminals that mate with corresponding contacts on a flexible printed circuit. Interconnect paths on the flexible printed circuit may be used to route signals for the electrical components. The flexible printed circuit may be wrapped into the shape of a cylindrical tube and may be mounted on an interior surface of the cylindrical housing or on the exterior surface of the support structure.

15 Claims, 17 Drawing Sheets

(51) Int. Cl.
*H05K 1/18* (2006.01)
*H05K 1/02* (2006.01)

(56) References Cited

U.S. PATENT DOCUMENTS

| | | | |
|---|---|---|---|
| 6,377,408 B1* | 4/2002 | Shinohara | G11B 7/0932 359/814 |
| 6,493,511 B2* | 12/2002 | Sato | H05K 1/028 396/462 |
| 6,710,950 B2 | 3/2004 | Rouvinen et al. | |
| 7,287,987 B2 | 10/2007 | Heisen et al. | |
| 7,507,001 B2 | 3/2009 | Kit | |
| 9,444,242 B2* | 9/2016 | Ciampa | H02G 11/003 |
| 2004/0196999 A1* | 10/2004 | Han | H04R 1/2819 381/345 |
| 2008/0084657 A1* | 4/2008 | Baba | G04G 17/08 361/679.01 |
| 2011/0012535 A1* | 1/2011 | West | F21L 4/005 315/307 |
| 2013/0086722 A1* | 4/2013 | Teetzel | F41H 1/04 2/2.5 |
| 2013/0250585 A1 | 9/2013 | Le Toquin et al. | |
| 2013/0289412 A1* | 10/2013 | Corl | A61B 8/12 600/467 |
| 2014/0250657 A1* | 9/2014 | Stanley | F16B 11/008 29/426.2 |
| 2014/0276004 A1 | 9/2014 | Strupeck et al. | |
| 2014/0361931 A1* | 12/2014 | Irci | H01Q 1/243 343/702 |
| 2015/0179717 A1* | 6/2015 | Kawata | H01L 29/7869 257/43 |
| 2015/0220109 A1* | 8/2015 | von Badinski | G01P 15/00 340/539.12 |
| 2016/0041663 A1* | 2/2016 | Chen | G06F 3/0412 345/174 |

\* cited by examiner

INTERCONNECT STRUCTURES FOR ELECTRONIC DEVICES WITH COMPONENT ARRAYS

This application claims the benefit of provisional patent application Ser. No. 62/057,746, filed Sep. 30, 2014, which is hereby incorporated by reference herein in its entirety.

BACKGROUND

This relates generally to electronic devices, and more particularly, to electronic devices with electronic components mounted to device housings.

Electronic devices include electronic components. Some components such as integrated circuits and batteries are mounted within interior portions of electronic device housings. Other components are mounted on the exteriors of housings. For example, components that emit or receive light or sound are often mounted in exposed locations on housings to facilitate proper operation of the components in supplying output and receiving input.

In some device designs, it may be desirable to mount multiple components in an array. For example, some electronic components benefit from operation as a coordinated group. It may be helpful in such arrangements to mount components in close proximity to each other. If care is not taken, components may be damaged during installation, damage may be created to the housing to which the components are being mounted, components may be difficult to repair when faults are detected, or components may consume more space within a device than desired. It may also be challenging to electrically interconnect the components in the array.

It would be desirable to be able to address these challenges with a component interconnect and mounting scheme that is suitable for use when mounting components in a variety of housings.

SUMMARY

An electronic device may have a housing wall. An array of electrical components may be mounted in a corresponding array of openings in the housing wall. The components may be audio components, light-based components, sensors, or other electrical components.

The housing may have a cylindrical shape or other curved shape. A support structure such as a hollow cylindrical tube may be mounted within the interior of the housing.

The electrical components may have terminals that mate with corresponding contacts on a flexible printed circuit. Interconnect paths on the flexible printed circuit may be used to route signals for the electrical components. The flexible printed circuit may be wrapped into the shape of a cylindrical tube and may be mounted on an interior surface of the cylindrical housing or on the exterior surface of the support structure.

DETAILED DESCRIPTION

Electronic devices may include components. The components may be light-based components, audio components, sensors, or other electrical components. The components may be mounted within the interior of an electronic device and/or may be mounted on the exterior of an electronic device. Configurations in which electrical components are exposed on the exterior of a housing may facilitate signal input and output operations using the components (e.g., input and output operations involving light signals, acoustic signals, temperature information, etc.). Accordingly, configurations in which components are mounted within openings in housing surfaces are sometimes described herein as an example.

In some devices, it may be desirable to mount multiple components in proximity to each other. For example, optical components may be mounted in proximity to each other to form a display with an array of pixels or to form other types of light output devices (e.g., a light-based status indicator), speakers may be mounted in an array to form a phased speaker array or to provide enhanced output levels, microphones may be mounted in an array to gather audio information from multiple directions, proximity sensors may be mounted in an array to create a touch or motion input device that can capture input from a user's hand or other external object, and other sensors and input-output components may be mounted in arrays to enhance the ability of an electronic device to gather input and provide output.

Multiple components may be mounted adjacent to one another in a regular array having one or more rows and one or more columns of electrical components. Components may also be organized in a less regular fashion such as a pseudorandom pattern on the surface of a device housing.

Illustrative electronic devices that may be provided with components are shown in FIGS. 1, 2, 3, 4, and 5.

Figure 1:
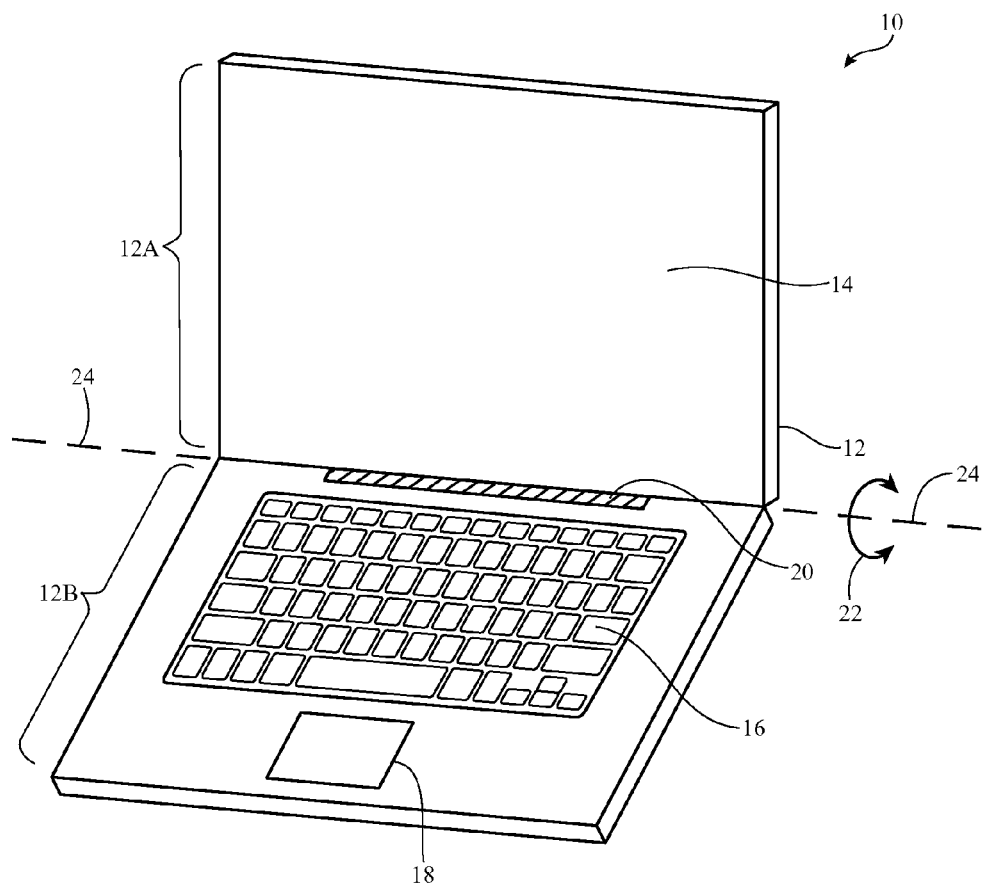
FIG. 1 is a perspective view of an illustrative electronic device such as a laptop computer in accordance with an embodiment.

Illustrative electronic device 10 of FIG. 1 has the shape of a laptop computer having upper housing 12A and lower housing 12B with components such as keyboard 16 and touchpad 18. Device 10 may have hinge structures 20 that allow upper housing 12A to rotate in directions 22 about rotational axis 24 relative to lower housing 12B. Display 14 may be mounted in upper housing 12A. Upper housing 12A, which may sometimes be referred to as a display housing or lid, may be placed in a closed position by rotating upper housing 12A towards lower housing 12B about rotational axis 24.

Figure 2:
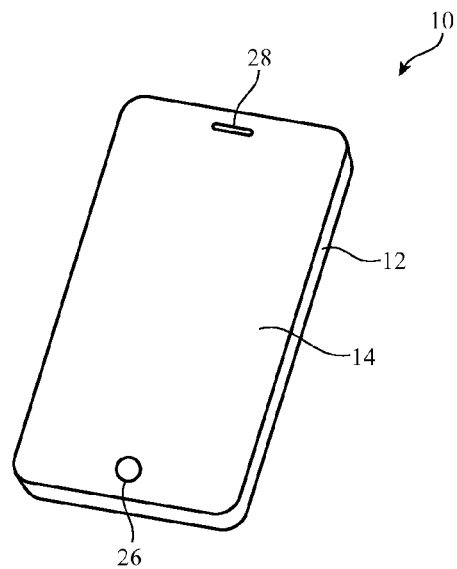
FIG. 2 is a perspective view of an illustrative electronic device such as a handheld electronic device in accordance with an embodiment.

FIG. 2 shows how electronic device 10 may be a handheld device such as a cellular telephone, music player, gaming device, navigation unit, or other compact device. In this type of configuration for device 10, housing 12 may have opposing front and rear surfaces. Display 14 may be mounted on a front face of housing 12. Display 14 may, if desired, have openings for components such as button 26. Openings may also be formed in display 14 to accommodate a speaker port (see, e.g., speaker port 28 of FIG. 2).

Figure 3:
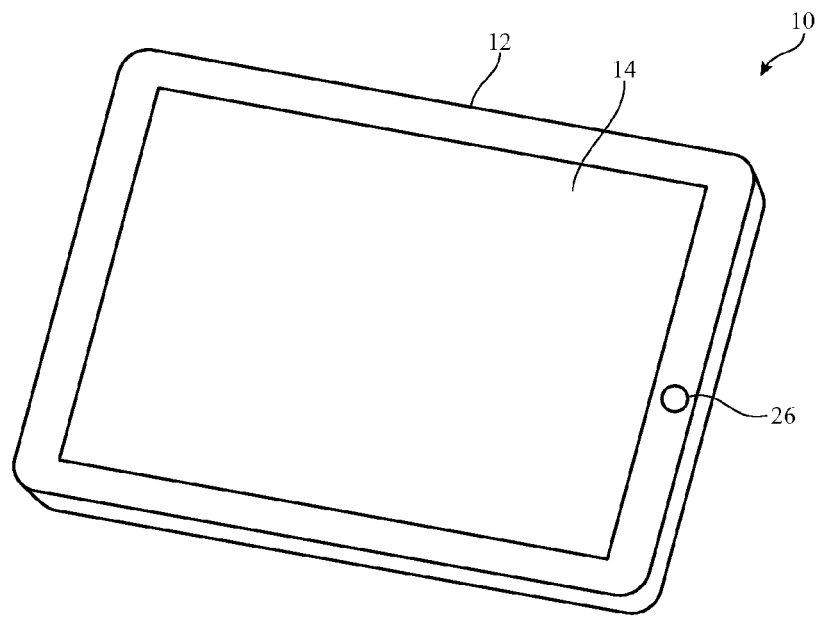
FIG. 3 is a perspective view of an illustrative electronic device such as a tablet computer in accordance with an embodiment.

FIG. 3 shows how electronic device 10 may be a tablet computer. In electronic device 10 of FIG. 3, housing 12 may have opposing planar front and rear surfaces. Display 14 may be mounted on the front surface of housing 12. As shown in FIG. 3, display 14 may have an opening to accommodate button 26 (as an example).

Figure 4:
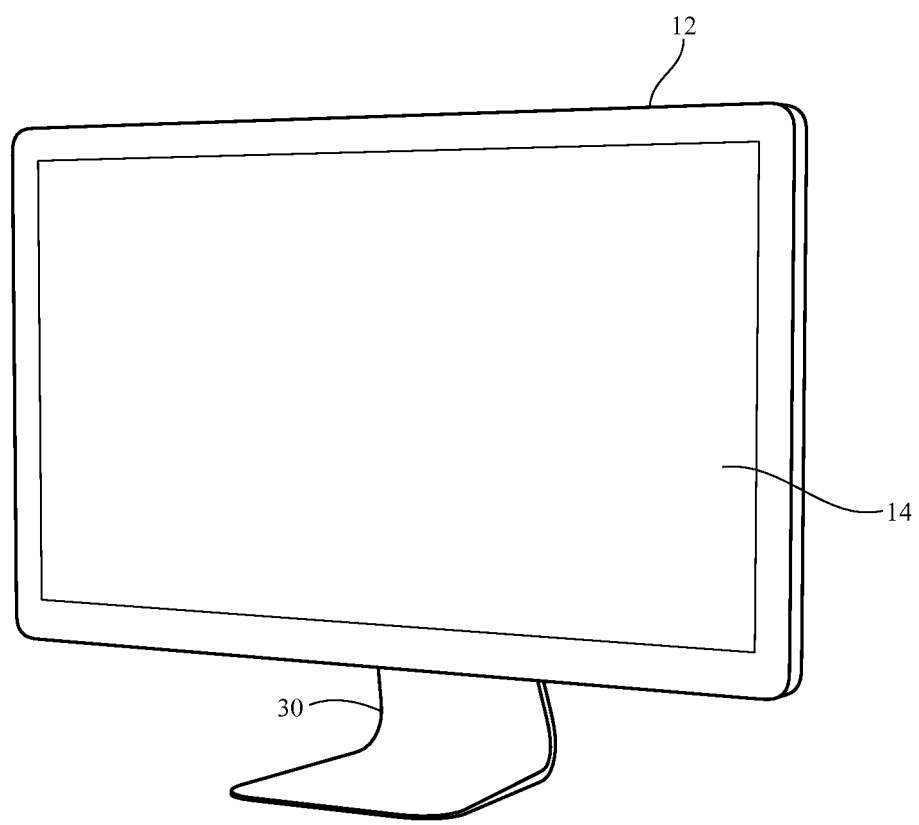
FIG. 4 is a perspective view of an illustrative electronic device such as a computer display in accordance with an embodiment.

FIG. 4 shows how electronic device 10 may be a computer display, a computer that has been integrated into a computer display, or a display for other electronic equipment. With this type of arrangement, housing 12 for device 10 may be mounted on a support structure such as stand 30 or stand 30 may be omitted (e.g., stand 30 can be omitted when mounting device 10 on a wall). Display 14 may be mounted on a front face of housing 12.

Figure 5:
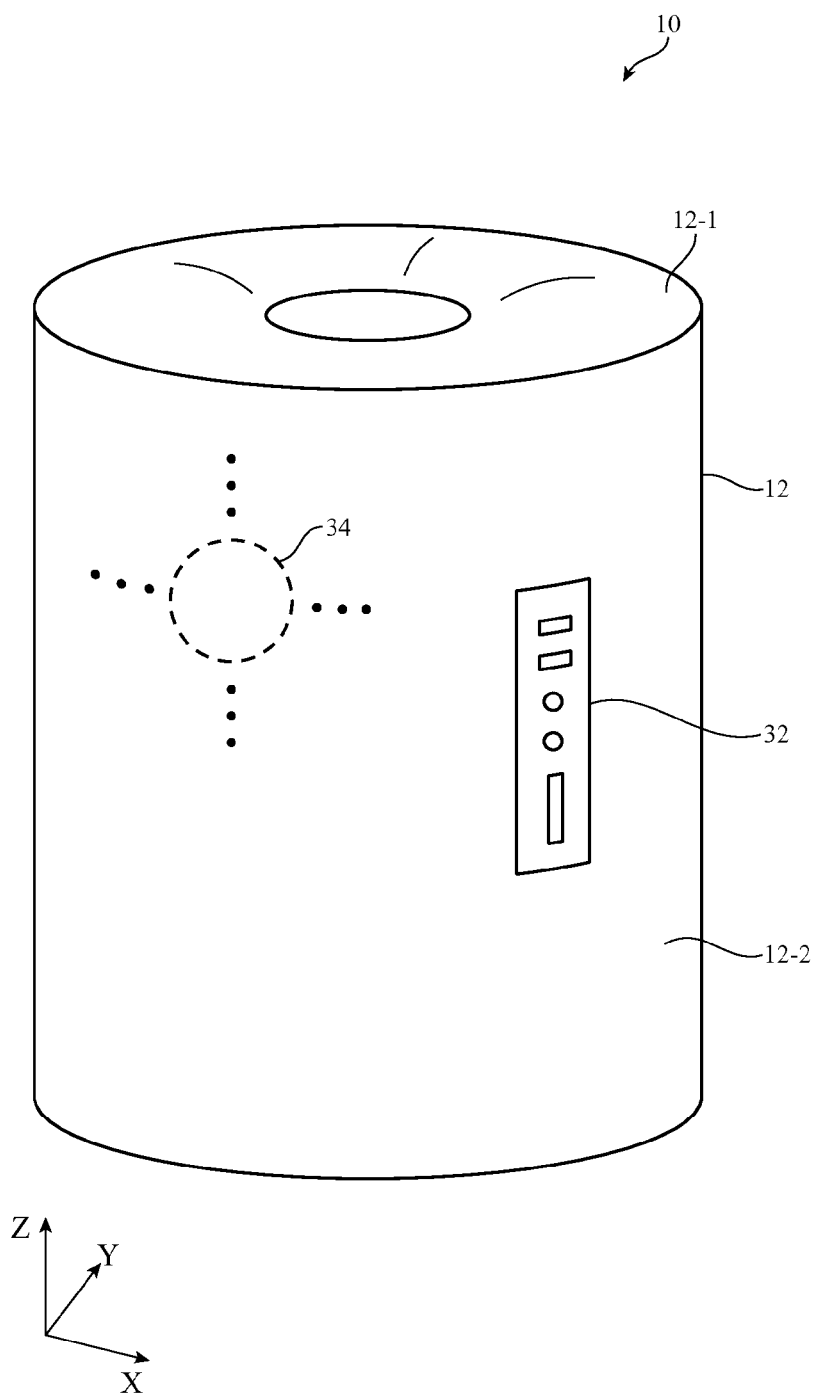
FIG. 5 is perspective of an illustrative electronic device such as a computing device or other device with a cylindrical housing that surrounds an interior region and that is surrounded by an exterior region in accordance with an embodiment.

FIG. 5 shows how electronic device 10 may have a cylindrical housing. Device 10 may be, for example, a desktop computer such as the Mac Pro computer available from Apple Inc. of Cupertino, Calif. Housing 12 may have an input-output connector region such as region 32 that contains input-output connectors (e.g., Universal Serial Bus connectors and other digital signal connectors, power connectors, audio connectors, memory card slots, and other input-output connectors). Upper surface 12-1 of housing 12 may be planar or may have curved surfaces (as shown in FIG. 5). Sidewall 12-2 of housing 12 may have a curved surface so that housing 12 has a cylindrical shape (as an example). Housing 12 may also have other shapes (e.g., conical shapes, pyramidal shapes with curved and/or planar sidewall surfaces, spherical housing shapes, other shapes, and combinations of these shapes).

Housing 12 may have a vertical dimension (height in dimension Z) that is larger than its lateral (horizontal) dimensions (i.e., widths in dimensions X and Y). Configurations in which housing 12 is shorter in height and wider in width may also be used. If desired, part of housing 12 may be cylindrical and part of housing 12 may have one or more planar sidewalls. For example, housing 12 may have the shape of a half cylinder in which the front portion of housing 12 has a cylindrical shape and the rear portion of housing 12 has a planar rear housing wall. Other shapes with cylindrical surfaces may also be used (e.g., quarter cylinders, three-quarter cylinders, etc.). Display 14 may be mounted in housing 12 or may be omitted from device 10 of FIG. 5.

The illustrative configurations for device 10 that are shown in FIGS. 1, 2, 3, 4, and 5 are merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, an accessory such as a charging station, a stand for a display, speaker or other electronic device, an alarm clock, a speaker, a docking station, an amplifier, a projector, a camera, a video camera, gaming equipment, a television cable box or other set-top box, lighting equipment, a motion sensor, a touch pad or other input-output device that gathers data from a touch sensor(s), networked attached storage or other data storage device, a wireless access point, a router, or other network equipment, other equipment, or equipment that implements the functionality of two or more of these devices.

Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 may include display pixels formed from liquid crystal display (LCD) components, organic light-emitting diode pixels, or other suitable image pixel structures. If desired, display 14 may be omitted from device 10 (e.g., to conserve space) or multiple displays such as display 14 may be included in device 10 (e.g., in an array). Light-based status indicators and other input-output devices may be used to supplement information displayed on display 14 or may be used to provide a user with status information and other output when display 14 has been omitted.

If desired, one or more electrical components may be mounted on housing 12. For example, a single component or an array of components may be mounted in the position(s) of illustrative component(s) 34 of FIG. 5 or elsewhere on housing 12 of FIG. 1, 2, 3, 4, or 5 or on other electronic device housings. Electrical components 34 may be mounted on a planar housing wall or a curved housing wall. Components 34 may, for example, be mounted an a surface of housing 12 where housing 12 has a non-planar surface such as where housing wall 12-2 of FIG. 5 is curved (e.g., curved on the side of a cylinder). In general, components 34 may be mounted on a curved surface such as a corner of a housing, a rounded edge of a housing, a curved sidewall, a curved front wall, a curved rear wall of housing 12, a curved top wall, etc. Configurations in which housing 12 has a cylindrical surface on which components 34 are mounted in an array (e.g., configurations of the type shown in FIG. 5 in which components 34 are mounted in an array on some or all of curved cylindrical outer surface 12-2 of housing 12) are sometimes described herein as an example.

The electrical components that are mounted to housing 12 such as components 34 of FIG. 5 may be electrical components such as light-emitting diodes, lamps, displays, lasers, or other light-emitting components, may be vibrators, buzzers, speakers, tone-generators, microphones, or other acoustic components, may be sensors such as touch sensors, temperature sensors, accelerometers, compasses, gyroscopes, position sensors, proximity sensors, or may be other suitable electronic components.

Figure 6:
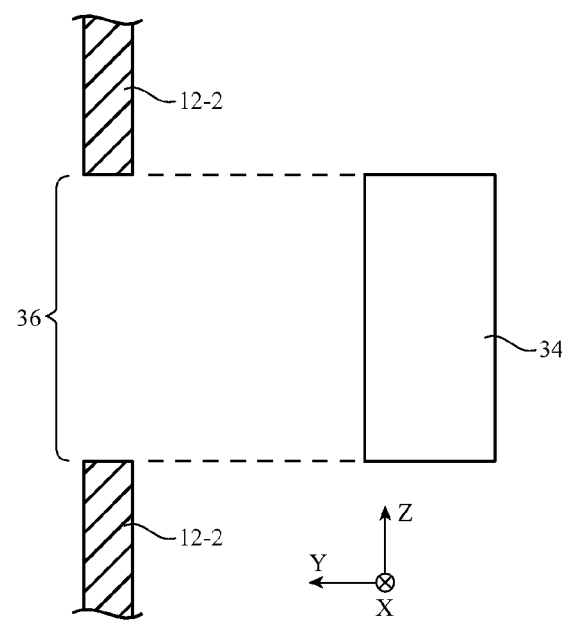
FIG. 6 is a cross-sectional side view of an illustrative electronic component being mounted in an opening in a device housing in accordance with an embodiment.

As shown in FIG. 6, each component 34 may be mounted in a respective opening in housing wall 12-2 such as opening 36. Component 34 may be mounted from the exterior of device 10 or from the interior of housing 12. After component 34 has been placed within opening 36, fasteners or other suitable attachment mechanisms (e.g., clips, adhesive, springs, other engagement features, etc.) may be used in securing component 34 to housing wall 12-2.

Figure 7:
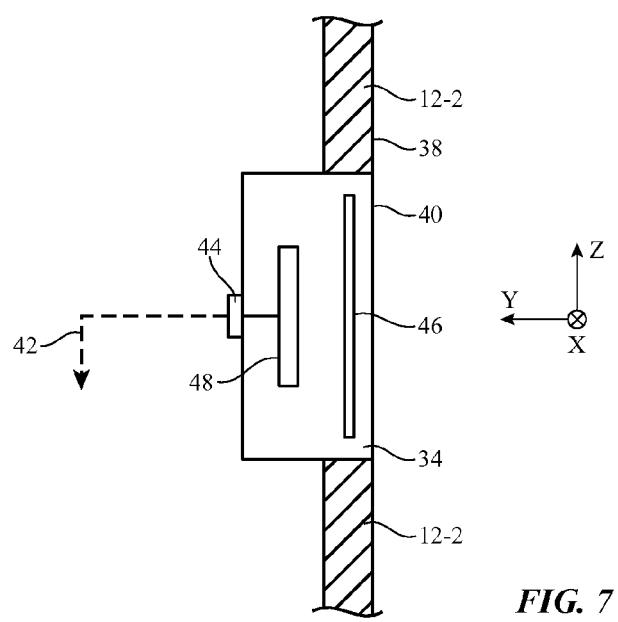
FIG. 7 is a cross-sectional side view of the illustrative electronic component of FIG. 6 following mounting of the component to the device housing in accordance with an embodiment.

As shown in FIG. 7, component 34 may be mounted so that some or all of exterior component surface 40 is flush (or nearly flush) with outer surface 38 of housing wall 12-2. In configurations in which housing wall 12-2 is curved (e.g., when wall 12-2 forms part of a cylinder), external component surface 38 may have a matching curved surface (e.g., some or all of the curvature of surface 40 of component 34 may match (or nearly match) the curvature of housing wall surface 38.

Electrical components 34 may be coupled to control circuitry using signal paths such as signal path 42 of FIG. 7. Signal path 42 may include one or more conductive lines on printed circuits or other substrates, wires, optical fibers, light-pipes, cables, plastic carriers with metal traces or other electrical signal lines, or other signal paths. The electrical and/or optical paths that are coupled to components 34 may be used to carry power signals, digital and/or analog signals (e.g., control signals, image data, audio signals, sensor information, etc.), or other signals.

Connectors such as connector 44 of FIG. 7 may be used to facilitate attachment of the electrical components to signal path 42. For example, components 34 may each have a respective connector such as connector 44 of FIG. 7 that mates with a corresponding connector on an optical and/or electrical cable or other signal path 42. Connector 44 may be a zero insertion force cable or other printed circuit connector, may be a coaxial connector or other rotationally symmetric connector for audio and/or radio-frequency signals, may be a power connector, may be a Universal Serial Bus connector or other digital data connector, may be an Ethernet connector, may be an audio connector, may be an optical connector, may be a male connector, may be a female connector, may be a locking connector, may be an reversible (orientation independent) connector with two or more operating positions, or may be any other suitable connector. If desired, connector 44 may have mating contacts that can be coupled and decoupled without using a fixed connection such as a solder or conductive adhesive connection Alternatively, connections between component 34 and a signal path may be made by using solder or conductive adhesive to join mating contacts (e.g., contacts on components 34 and mating contacts on a cable, printed circuit substrate, or other carrier with metal traces or other electrical signal lines).

Components such as component 34 of FIG. 7 may contain subcomponents such as subcomponents 46 and 48. Subcomponent 46 may be located near the front face of component 34 and may be a lens or lens system (e.g., when component 34 is an optical component), may be a diaphragm or speaker grill (e.g., when component 34 is a speaker), may be a microphone diaphragm, may be an optically or acoustically transparent window structure, may be a dielectric member (e.g., to form a window that allows electromagnetic signals for a sensor to pass through the window), may be a thermally conductive member that allows heat to pass into component 34, or may be other suitable front-of-component subcomponent. Subcomponent 48 may be a light source such as a light-emitting diode, laser, or lamp, may be a light detector such as an image sensor or photodetector, may be a speaker driver (e.g., a driver that drives a diaphragm), may be a temperature sensor such as a solid state temperature sensor or a thermocouple, may be a motion sensor, capacitive sensor, or other type of sensor, or may be other suitable electrical subcomponent for supporting the operation of component 34.

Figure 8:
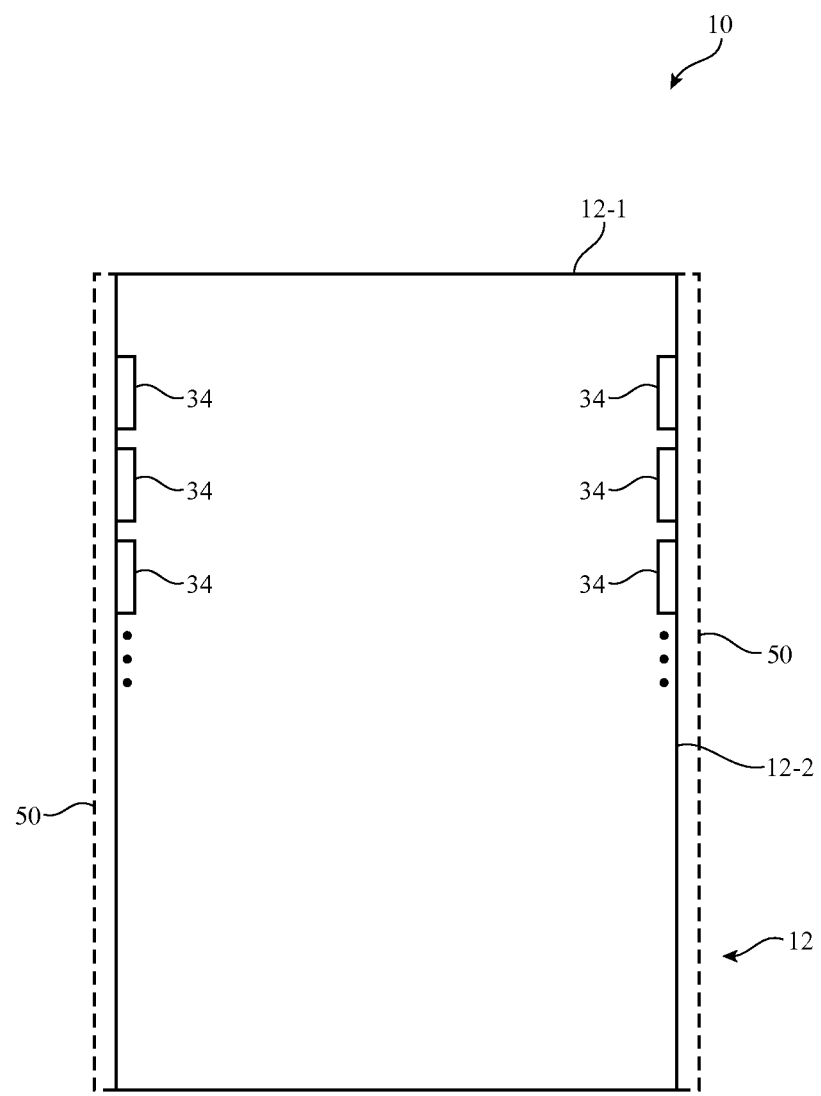
FIG. 8 is a cross-sectional side view of an electronic device showing how an array of components may be mounted to the exterior of a device housing in accordance with an embodiment.

If desired, components 34 may be mounted in a continuous (or nearly continuous) array of rows and columns on the outer curved surface of cylindrical housing wall 12-2, as shown in the illustrative cross-sectional side view of device 10 in FIG. 8. Components 34 may also be mounted on internal housing structures and/or walls such as upper wall 12-1. An optional covering such as covering 50 may be used to cover components 34. Covering 50 may be acoustically transparent (e.g., covering 50 may be a plastic mesh and/or metal mesh or other cover with openings to allow sound to pass), may be optically transparent (e.g., by using a transparent or semi-transparent material or pattern of material such as frosted glass, plastic with a thin semitransparent coating or patterned coating layer), may be sufficiently thermal conductive to allow temperature measurements to be made through covering 50 (e.g., a thin metal cover), or may be any other suitable covering structure for improving device aesthetics, enhancing component protection, etc.

There may be any suitable number of components 34 in the array of components on wall 12-2 (e.g., one or more, two or more, five or more, 10 or more, 20 or more, 50 or more 2-200, 5-150, 20-100, less than 100, less than 50, less than 300, less than 20, 20-70, 20-100, or other suitable number). The distance between adjacent components 34 may be less than 10 mm, 2-5 mm, less than 20 mm, more than 3 mm, between 1-15 mm, less than 5 mm, etc.

Figure 9:
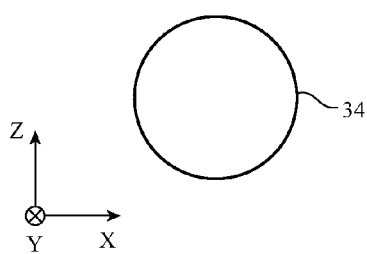
FIG. 9 is a front view of an illustrative electronic component with a circular outline in accordance with an embodiment.
Figure 10:
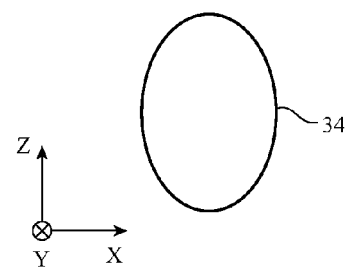
FIG. 10 is a front view of an illustrative electronic component with an oval outline in accordance with an embodiment.
Figure 11:
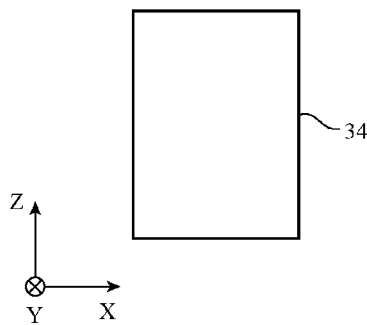
FIG. 11 is a front view of an illustrative electronic component with a rectangular outline in accordance with an embodiment.
Figure 12:
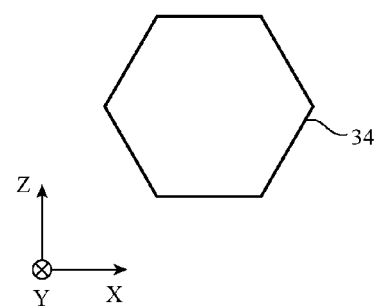
FIG. 12 is a front view of an illustrative electronic component with a hexagonal outline in accordance with an embodiment.

Components 34 may have any suitable shapes such as box shapes, frustoconical shapes (e.g., frustoconical shapes with planar and/or curved ends), pyramidal shapes, shapes with front surfaces that are wider than their opposing rear surfaces, shapes with curved edges and/or straight edges, shapes with curved front surfaces, etc.), cone shapes, step-wise varying cone shapes, spherical shapes, disk shapes, shapes with combinations of curved and straight edges and planar and/or curved sidewalls, etc.). FIGS. 9, 10, 11, and 12 are front views of illustrative shapes that may be used for components 34. In the example of FIG. 9, component 34 has a circular outline when viewed from the front (i.e., when viewed from the exterior of device 10 when component 34 has been mounted in housing sidewall 12-2). In the example of FIG. 10, component 34 has an oval outline when viewed from the front. FIG. 11 shows how component 34 may have a rectangular outline when viewed from the front. In the illustrative configuration of FIG. 12, component 34 has a hexagonal shape when viewed from the front. Other shapes may be used for component 34 if desired. The examples of FIGS. 9, 10, 11, and 12 are merely illustrative.

Figure 13:
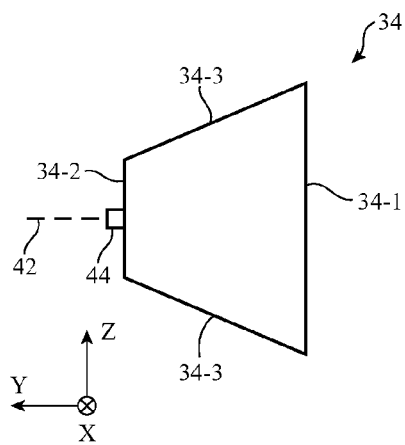
FIG. 13 is a cross-sectional side view of an illustrative electronic component with a trapezoidal cross section in accordance with an embodiment.
Figure 14:
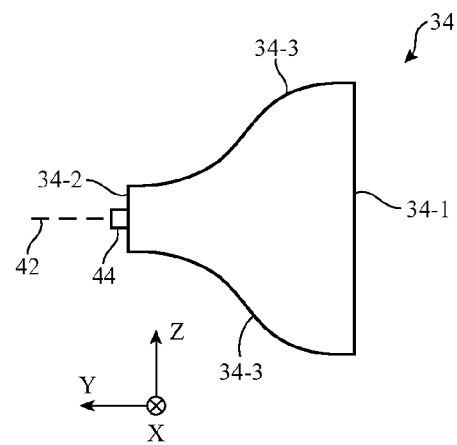
FIG. 14 is a cross-sectional side view of an illustrative electronic component with a smoothly tapered cross section in accordance with an embodiment.
Figure 15:
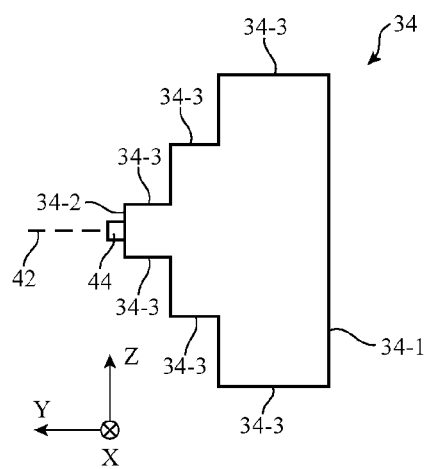
FIG. 15 is a cross-sectional side view of an illustrative electronic component with a cross section that is tapered in a step-wise fashion in accordance with an embodiment.
Figure 16:
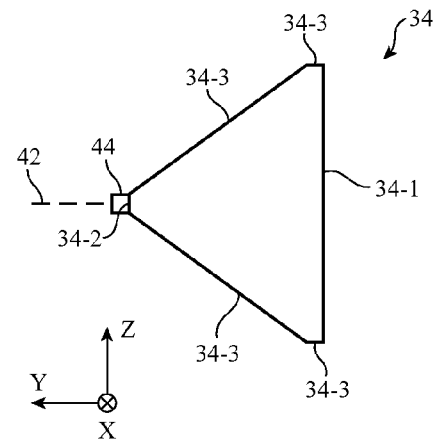
FIG. 16 is a cross-sectional side view of an illustrative electronic component with a cross section that is triangular in shape and has untapered portions in accordance with an embodiment.

Cross-sectional side views of components 34 of different illustrative shapes are shown in FIGS. 13, 14, 15, and 16. As shown in FIG. 13, component 34 may have a front face such as front face 34-1, an opposing rear face such as rear face 34-2, and side surfaces such as surfaces 34-3. Some or all of front face 34-1 may lie flush with outer surface 38 of housing 12-2 (i.e., front face 34-1 of component 34 may form exterior surface 40 of FIG. 7). In the example of FIG. 13, front face 34-1 has larger lateral dimensions (in vertical dimension Z and horizontal dimension X) than rear face 34-2. Side surfaces 34-3 form a tapering shape so that component 34 is wider at the front than at the rear. Side surfaces 34-3 are straight in the cross-sectional side view of FIG. 13. In the illustrative configuration of FIG. 14, side surfaces 34-3 have smoothly tapering curved profiles. FIG. 15 shows how side surfaces 34-3 may progressively narrow component 34 in a step-wise fashion. In the example of FIG. 16, side surfaces 34-3 have portions in which component 34 does not taper and portions in which component 34 tapers. Connector 44 may be mounted on rear surface 34-2 of component 34 or elsewhere in component 34. If desired, other side profiles may be used for component 34 (e.g., tapered and/or non-tapered profiles). The configurations of FIGS. 13, 14, 15, and 16 are shown as examples.

Figure 17:
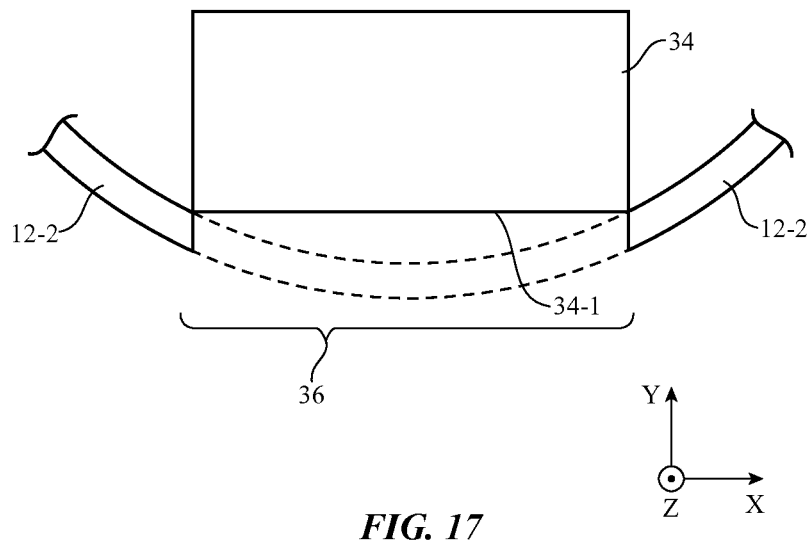
FIG. 17 is a top view of an illustrative component with a flat outer surface that has been mounted in an opening in a cylindrical housing in accordance with an embodiment.
Figure 18:
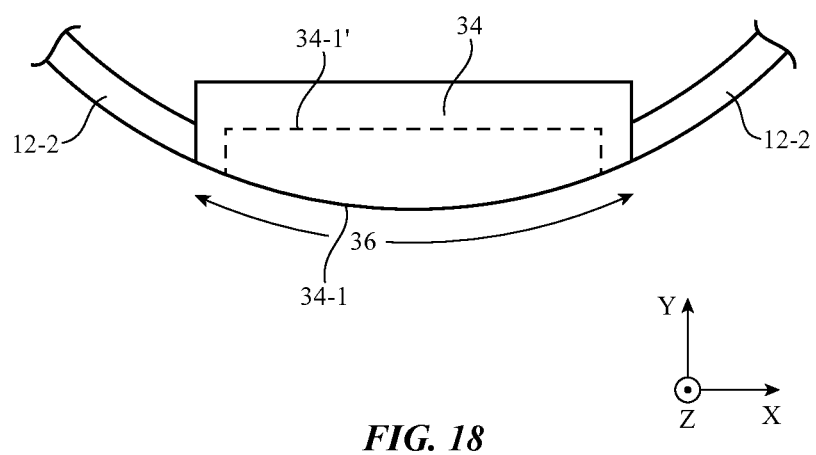
FIG. 18 is a top view of an illustrative component with a curved outer surface that has been mounted in an opening in a cylindrical housing in accordance with an embodiment.

It may be desirable to provide front face 34-1 of component 34 with a surface shape that matches the surface shape of housing wall 12-2. For example, if housing wall 12-2 has a cylindrical shape with a curved (circular) outer surface, component 34 may have a matching curved outer surface. FIG. 17 is a top view of an illustrative configuration in which component 34 has a front surface (surface 34-1) that is planar. As a result, surface 34-1 does not match the curvature of the curved outer surface of cylindrical housing wall 12-2. FIG. 18 shows how component 34 may be provided with a curved outer surface (surface 34-1) that matches the curved outer surface of cylindrical housing wall 12-2. If desired, peripheral edges of surface 34-1 or other portion of surface 34-1 may match the curved surface of cylindrical housing wall 12-2 and other portions (e.g., central portion 34-1') may have other surface shapes (e.g., protruding and/or recessed shapes, planar shapes, dome-shaped configurations, etc.).

Figure 19:
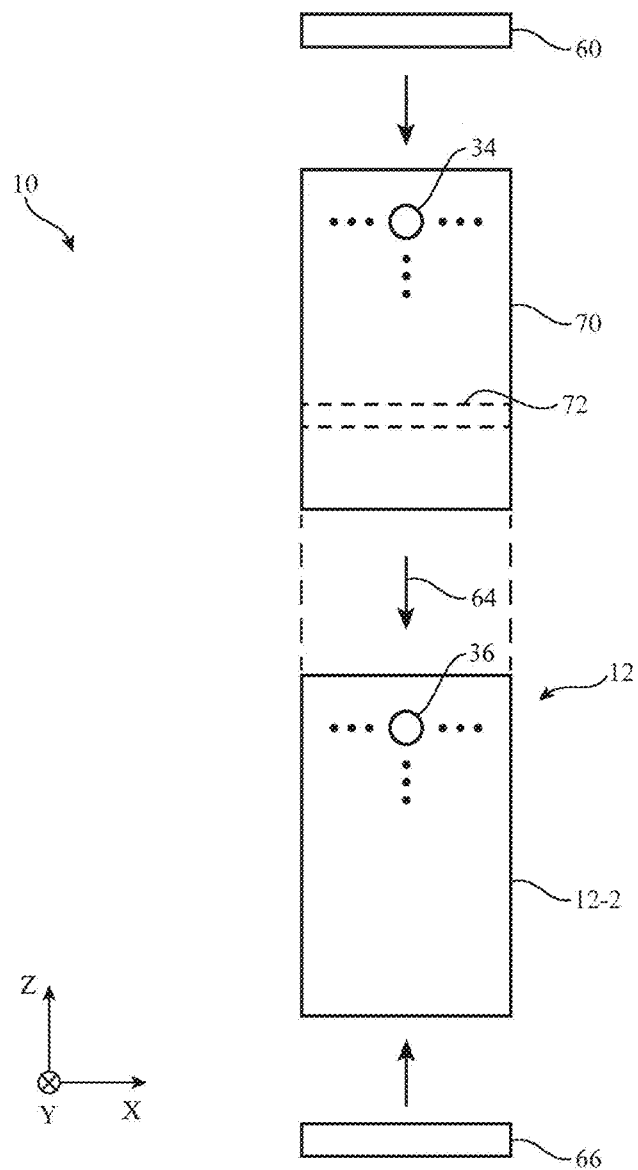
FIG. 19 is an exploded view of an illustrative electronic device containing radially deployed components in accordance with an embodiment.

FIG. 19 is an exploded view of device 10 in an illustrative configuration in which an inner support structure such as support structure 70 is used to support one or more components 34 within housing 12. As shown in FIG. 19, components 34 may, if desired, by formed in an array on the surface of support structure 70 in a pattern that matches an array of openings 36 in housing wall 12-2 of housing 12. Support structure 70 may have a shape that allows support structure 70 and components 34 to be mounted within the interior of housing 12. If, for example, housing 12 has a cylindrical shape or other shape with curved walls 12-2, support structure 70 may have a corresponding cylindrical shape or other shape with matching curved walls. Configurations in which housing 12 and/or support structure 70 have box shapes or other shapes with planar walls may also be used.

The dimensions of support structure 70 may be smaller than the interior dimensions of housing 12 to allow support structure 70 and components 34 to be installed within housing 12. For example, in configurations in which housing 12 is cylindrical in shape, the inner diameter of housing 12 may be larger than the outer diameter of structure 70 and components 34 to ensure that structure 70 and components 34 can be inserted into the interior of housing 12 in direction 64 (e.g., along the longitudinal axis of elongated structures such as housing 12 and support structures 70 of FIG. 19).

If desired, structure 70 may have a hollow interior. One or more inner wall structures such as wall 72 may be used as baffles to separate the interior of structure 70 into separate cavities or inner wall structures such as wall 72 may be omitted. Components such as components 60 and 66 may be mounted to the upper and lower ends of structure 70 and housing 12. Components 60 and 66 may be light-based components such as lamps, light-emitting diodes, or displays, may be input-output components such as buttons or touch sensors, may be input-output ports, may be speakers, microphones, or other audio components, may be printed circuit boards containing integrated circuits and other circuitry, or may be other electrical components. As shown in FIG. 19, component 60 may be installed in the upper end of device 10 (e.g., component 60 may be mounted within an open upper end in a cylindrical inner structure such as structure 70 using a sealed or unsealed mounting arrangement). Component 66 may be installed in the lower end of device 10 (e.g., component 66 may be mounted within an open lower end in a cylindrical inner structure such as structure 70 using a sealed or unsealed mounting arrangement).

Components 34 may be mounted in openings 36 using threaded mounting arrangements, using press-fit attachment techniques, using adhesive, screws and nuts, or other mechanical fastening techniques, using component deployment structures that press components 34 radially outward into openings 36, or using other suitable component mounting structures. Once installed, control circuitry in device 10 can gather signals from components 34 and/or may provide signals to components 34. The control circuitry may include integrated circuits, memory, microprocessors, microcontrollers, application-specific integrated circuits (e.g., audio circuits and/or video circuits, sensor processing circuits, display driver circuits, etc.), audio drivers, or other suitable control circuitry. In some arrangements, the control circuitry may both supply output signals to components 34 and receive input signals from components 34. In other arrangements, the control circuitry may only supply output signals to components 34 or may only supply input signals to components 34.

In some applications, such as applications in which each of the components 34 in an array of components in device 10 is to be operated independently, it may be desirable to route signals to and/or from each component 34 separately. In this way, data may be gathered independently from each sensor in an array of sensor-based components, light output can be adjusted independently for each light-emitting diode or other light source in an array of light-based components, or audio data can be output (or received) by independently controlling audio components (e.g., independently controlled speakers in an array of speakers, independently controlled microphones in an array of microphones, etc.).

Signal paths between the control circuitry of device 10 and each component 34 may be provided using metal traces on a dielectric substrate or other support structure, using stamped metal foil with a desired pattern of metal lines, using wires, using portions of a device housing, using machined metal parts (e.g., brackets), using screws, using springs and other metal structures, or using other conductive signal path structures. Metal traces can be formed by depositing a blanket layer of metal (e.g., aluminum, copper, etc.) followed by photolithographic patterning or other patterning techniques, can be formed by evaporating or sputtering metal through a shadow mask, may be formed by ink jet printing of metallic paint (ink), may be formed by screen printing of metal paint (e.g., silver paint to form silver lines), or may be formed using other deposition and/or patterning techniques.

Examples of dielectric substrates include printed circuits (e.g., rigid printed circuit boards formed from fiberglass-filled epoxy or other rigid printed circuit board material, flexible printed circuits formed from flexible polyimide sheets, polyethylene terephthalate (PET) sheets, or other layers of flexible polymer), molded or machined pieces of plastic that serve as dielectric carriers, glass, ceramic, sapphire, or other dielectric materials. An advantage of thin polymer layers such as PET sheets or other polymer sheets with silver lines or other metal lines is that these layers can be bent to conform to the exterior or interior surface of a curved structure. For example, a flexible printed circuit formed from a PET sheet or other polymer sheet that contains metal traces (e.g., silver traces, etc.) can be mounted on the exterior of a cylindrical structure such as support structure 70 and/or may be mounted on the interior of a cylindrical structure such as housing wall 12-2 (i.e., the flexible printed circuit can be wrapped into a cylindrical tube shape).

Metal traces can be formed in a single layer (e.g., the outer surface) of a polymer substrate (e.g., to minimize cost and complexity) or may be configured to form multiple layers of signal lines interconnected by vias (e.g., lines in a multilayer flexible printed circuit).

Figure 20:
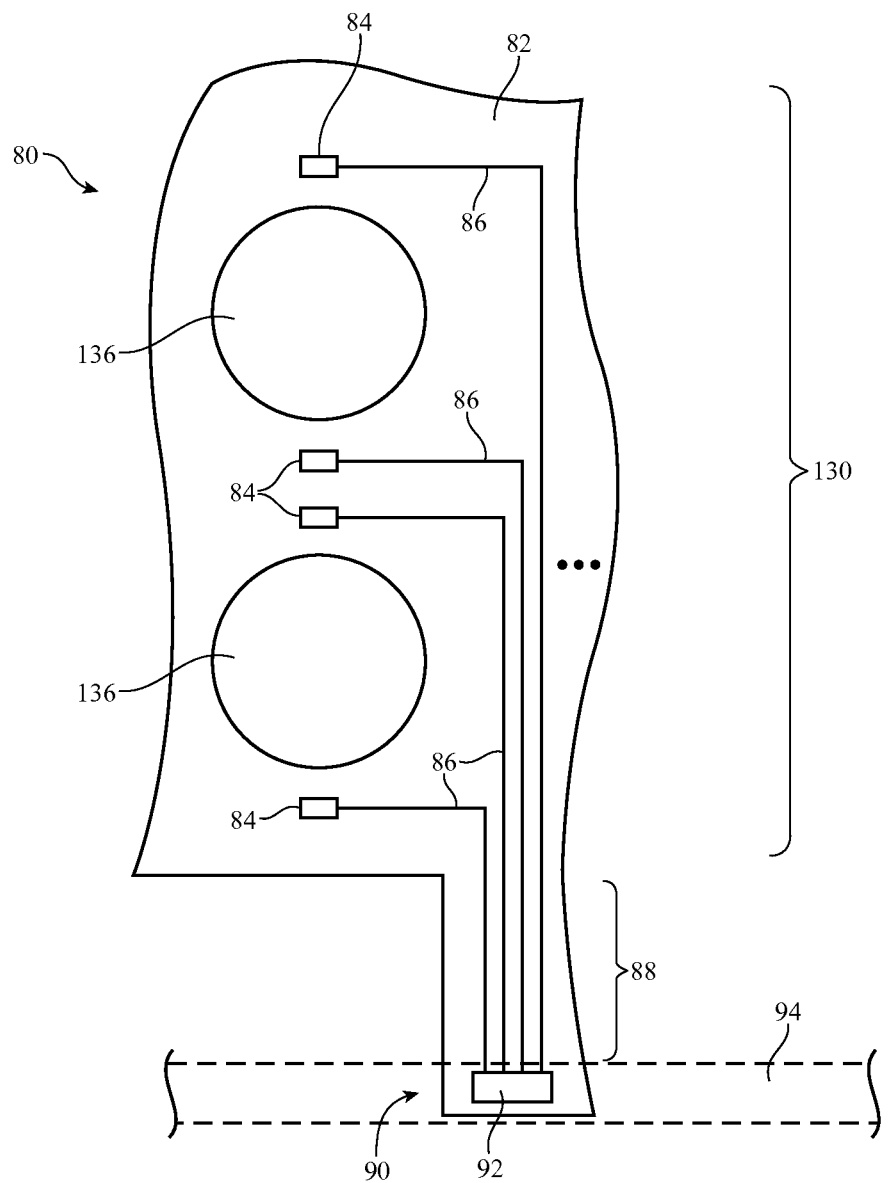
FIG. 20 is a diagram showing illustrative interconnection paths that may be formed on a substrate that has an array of openings that receive components in accordance with an embodiment.

When mounting a component interconnect substrate such as a flexible printed circuit on the inner surface of housing wall 12-2, it may be desirable to form an array of openings that are aligned with the array of openings 36 on housing wall 12-2. An illustrative flexible printed circuit of the type that may be used to form an interconnection structure for an array of components 34 is shown in FIG. 20. In the example of FIG. 20, flexible printed circuit 80 has dielectric substrate 82 and metal traces 86. Metal traces 86 may be patterned to from contacts 84 (sometimes referred to as contact pads or flexible printed circuit contacts). Dielectric substrate 82 may be a thin flexible layer of polymer such as a PET layer, a polyimide layer, etc. Openings 136 may have the same shape and size as openings 36 or may have openings of other suitable shapes, provided that openings 36 are not blocked. Examples of shapes that may be used for openings 136 and/or openings 36 include circles, rectangles, hexagons, ovals, shapes with straight edges and/or curved edges, etc.

The ends of metal traces 86 adjacent to each opening 136 may be patterned to form contacts 84. Components 34 may have terminals. The terminals may have springs, spring-loaded pins, metal pads, conductive foam, or other conductive structures (e.g., compressible conductive structures). These conductive structures may mate with contacts 84 on printed circuit 80 when components 34 and printed circuit 80 are assembled within device 10. If desired, solder, welds, conductive adhesive, screws, or other conductive structures may be used to form conductive connections between the terminals of components 34 and contacts 84. These materials can also be omitted (e.g., in configurations in which there is sufficient spring force or other biasing force to form a satisfactory direct metal-to-metal electrical connection between the component terminals and contacts on printed circuit 80).

There may be any suitable number of terminals associated with each component 34 and each opening 136. For example, each component 34 may have two or more terminals, three terminals, four terminals, less than five terminals, etc. Each opening 136 may have a corresponding number of adjacent contacts 84. In the example of FIG. 20, there are two contacts 84 associated with each opening 136 and two terminals on each component 34 that mate with these two contacts 84.

Main portion 130 of printed circuit 80 may be laminated to the cylindrical interior surface of housing wall 12-2 so that each opening 136 is aligned with a corresponding one of openings 36. This allows openings 36 (and openings 136) to receive components 34. Adhesive or other attachment mechanisms may be used to attach main portion 130 to the inner surface of wall 12-2. When attached to the inner surface of wall 12-2, main portion 130 may be rolled into the shape of a hollow tube. The ends of main portion 130 (e.g., the left and right edges of a flattened printed circuit forming portion 130) may abut each other when rolled into a tube on the inner surface of wall 12-2 (i.e., main portion 130 of printed circuit 80 may form a cylindrical tube shape).

Printed circuit 80 may have one or more integral tail portions such as tail 88. Traces 86 may run parallel to the length of each tail 88. With one suitable arrangement, printed circuit 80 may have three separate tails 88, each of which is separated by an equal distance from the other two tails in printed circuit 80. Collections of metal traces 86 may form signal busses on tails 88. Tails 88 may be coupled to additional circuitry in device 10. For example, each tail 88 may have a connector 92 that couples traces 86 on printed circuit 80 to corresponding traces on substrate 94.

Figure 21:
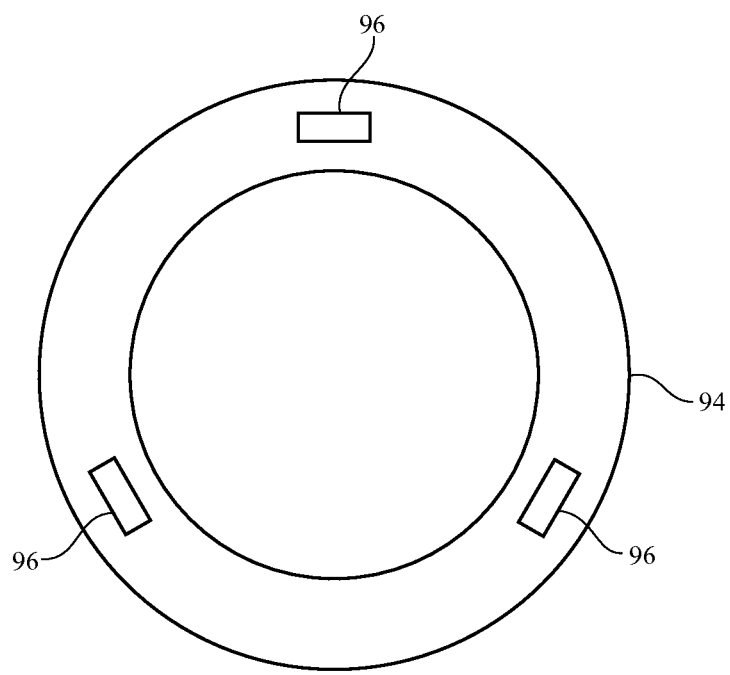
FIG. 21 is a top view of a substrate such as a ring-shaped printed circuit board that may receive signals from an interconnection substrate of the type shown in FIG. 20 through tails of the interconnection substrate that are coupled to the ring-shaped printed circuit board in accordance with an embodiment.

Substrate 94 may be a flexible or rigid printed circuit, a rigid molded plastic carrier, or other dielectric substrate. As shown in FIG. 20, substrate 94 may have a ring shape and may have three connectors 96, each of which is spaced apart from the next by 120° around the periphery of the ring. Each of connectors 96 may mate with a respective one of connectors 92 of FIG. 20 (as an example). Integrated circuits (e.g., control circuitry for controlling components 34 and other components in device 10) may be mounted on printed circuit 94 and/or other substrates in device 10. The ring shape of printed circuit 94 of FIG. 21 may allow printed circuit 94 to be mounted within the interior of cylindrical housing 12 (e.g., above or below wall 72 of FIG. 19, between the outer surface of support structure 70 and the opposing inner surface of housing 12, etc.).

Figure 22:
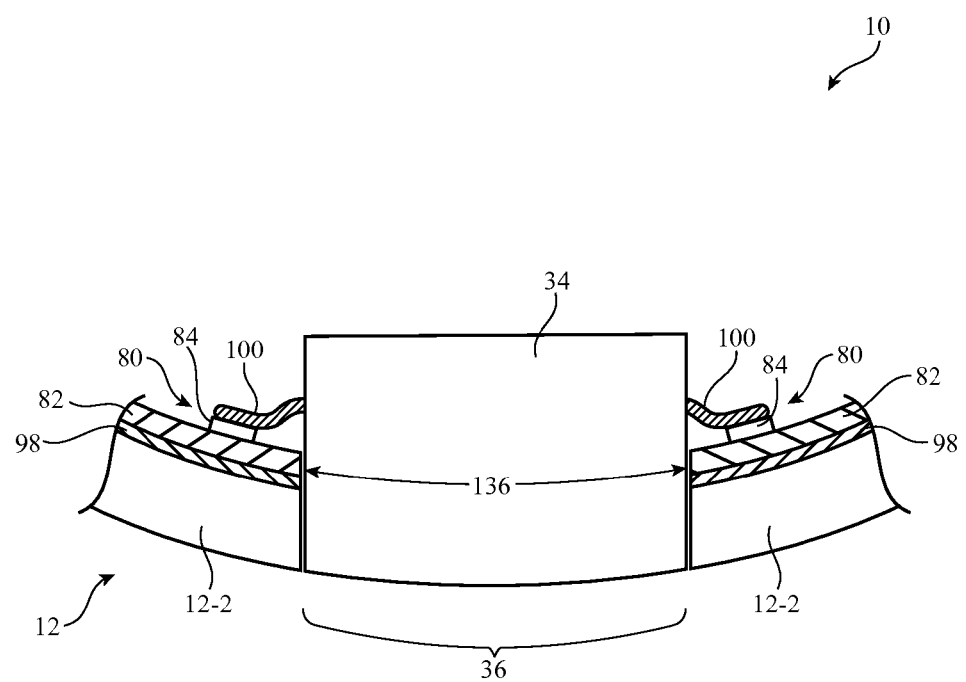
FIG. 22 is a cross-sectional top view of an illustrative component coupled to interconnection paths on a flexible substrate mounted to the inner surface of a curved housing wall in accordance with an embodiment.

FIG. 22 is a cross-sectional top view of an illustrative component 34 mounted in housing 12 in electrical contact with metal signal traces 82 on printed circuit 80. As shown in FIG. 22, openings 36 in housing wall 12-2 may be aligned with openings 136 in flexible printed circuit 80. Printed circuit 80 may have substrate 82. Substrate 82 may be attached to the inner surface of housing wall 12-2 using adhesive layer 98. Metal traces on printed circuit substrate 82 may form contacts 84. Component 34 may be received within openings 36 and 136. Component 34 may be mounted to housing 12 using screws and nuts, using threads that engage with threaded housing structures, using threads that engage with a cup-shaped internal component mounting structure, using adhesive, using interlocking features on housing 12 and component 34, or using other suitable mounting arrangements. When installed within openings 36, terminals 100 of components 34 make electrical connections with mating contacts 84. Terminals 100 may be springs (e.g., springy metal protrusions), may be spring-loaded pins, may be metal pads, or may be other suitable terminal structures. By forming electrical connections with contacts 84, signal traces 86 may be used to convey signals to and/or from each component 34.

If desired, a printed circuit with interconnections for components 34 may be mounted on an inner cylinder or other support structure within the interior of housing 12 (e.g., support structure 70). With this configuration, signal paths for components 34 are formed on the outer surface of support structure 70 rather than on the inner surface of housing wall 12-2.

Figure 23:
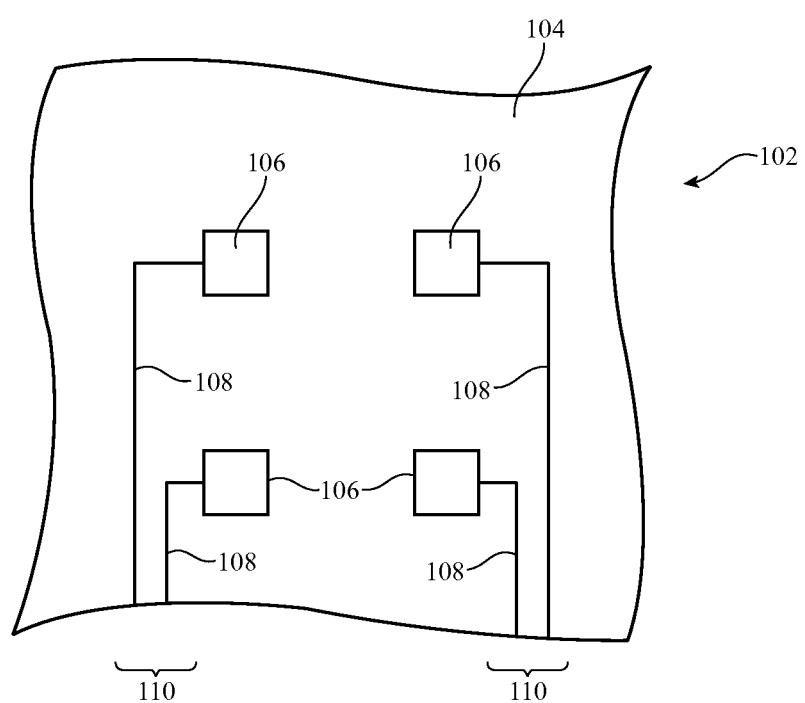
FIG. 23 is a diagram showing an illustrative pattern of contact pads and interconnection paths that may be formed on a substrate to provide signal paths for an array of components in accordance with an embodiment.

An illustrative flexible printed circuit of the type that may be mounted on support structure 70 in housing 12 is shown in FIG. 23. As shown in FIG. 23, flexible printed circuit 102 may have a flexible printed circuit substrate such as substrate 104 (e.g., a flexible PET layer, a flexible polyimide layer, or a sheet of other flexible polymer). Metal traces 108 may be formed on substrate 104. Metal traces 108 may be silver traces or traces formed from other metals. Pad portions of metal traces 108 may form contacts 106. There may be one or more, two or more, three or more, four or more, five or less, or other suitable number of contacts 106 on flexible printed circuit 102 for each component 34. Contacts 106 may be formed in an array having a pattern that is configured to mate with the pattern of terminals associated with components 34 in openings 36 of housing 12 when flexible printed circuit 102 contacts components 34.

Figure 24:
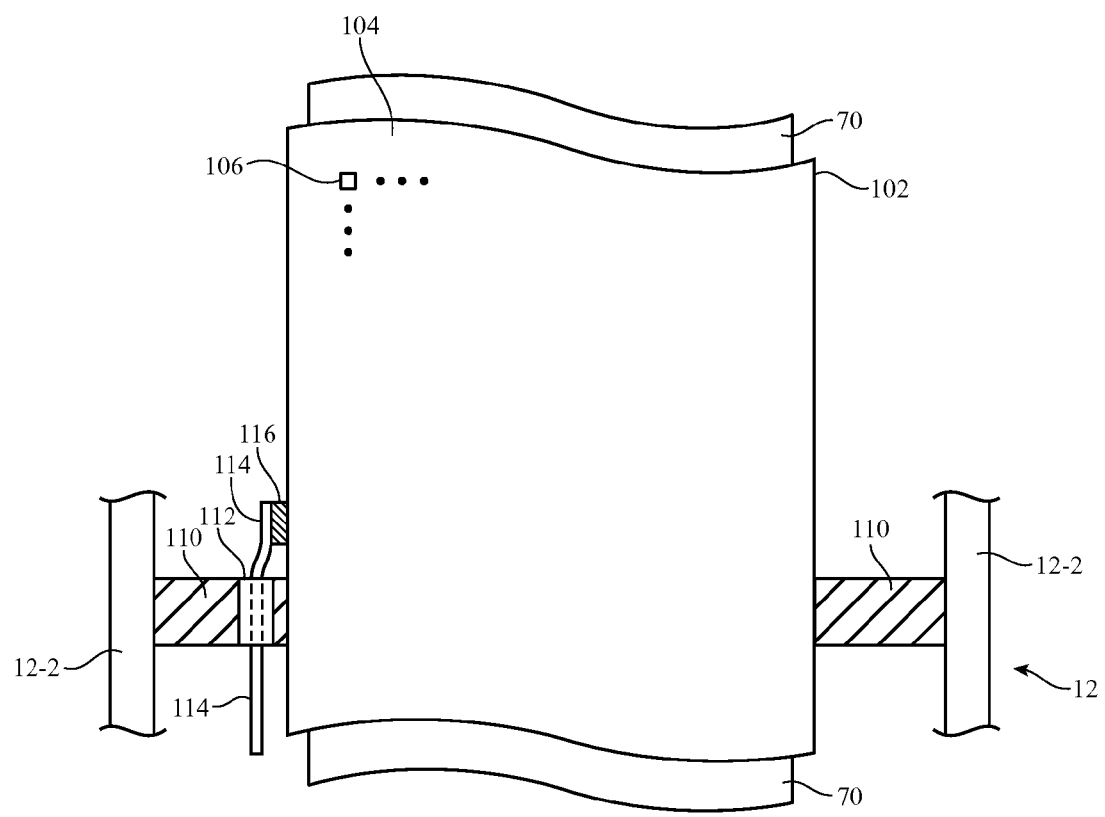
FIG. 24 is a cross-sectional side view of an illustrative electronic device having an inner support structure on which a flexible interconnection substrate has been mounted in accordance with an embodiment.

Printed circuit 102 may be wrapped around the exterior surface of cylindrical support structure 70, as shown in FIG. 24. The left and right edges of printed circuit 102 (when printed circuit 102 is laying flat prior to installation in device 10) may abut each other when printed circuit 102 is wrapped around cylindrical support structure 70 (i.e., printed circuit 102 may be wrapped into the shape of a tube). Support structure 70 may have curved (cylindrical) walls and may have a size that allows structure 70 (with printed circuit 102) to be inserted into the interior of housing 12, as shown in FIG. 19.

As shown in FIG. 24, an annular region of air may be interposed between the outer surface of support structure 70 and the inner surface of housing wall 12-2. If desired, one or more seals such as seal 110 may be formed at locations along the longitudinal axis of support structure 70. Seal 110 may be formed from a ring-shaped elastomeric structure that presses against the outer surface of printed circuit 102 on support structure 70 and that presses against the opposing inner surface of housing wall 12-2. Seal structure 110 may block undesired movement of air, light, or sound.

Cables, wires, flexible printed circuits, integral tails on printed circuit 102, or other signal paths may be used to couple control circuitry in device 10 to flexible printed circuit 102. As an example, flexible printed circuit cable 114 of FIG. 24 may be used to route signals to and/or from printed circuit 102. Flexible printed circuit cable 114 may be coupled to signal traces and contacts on printed circuit 102 using connection 116 (e.g., solder joints, welds, conductive adhesive joints, a connector, etc.). Seal structure 110 may have a portion such as plastic portion 112 that is overmolded over flexible printed circuit 114. Overmolded portion 112 ensures that the seal formed by seal structure 110 will not be compromised while allowing signals to pass between printed circuit 102 and other portions of device 10.

Figure 25:
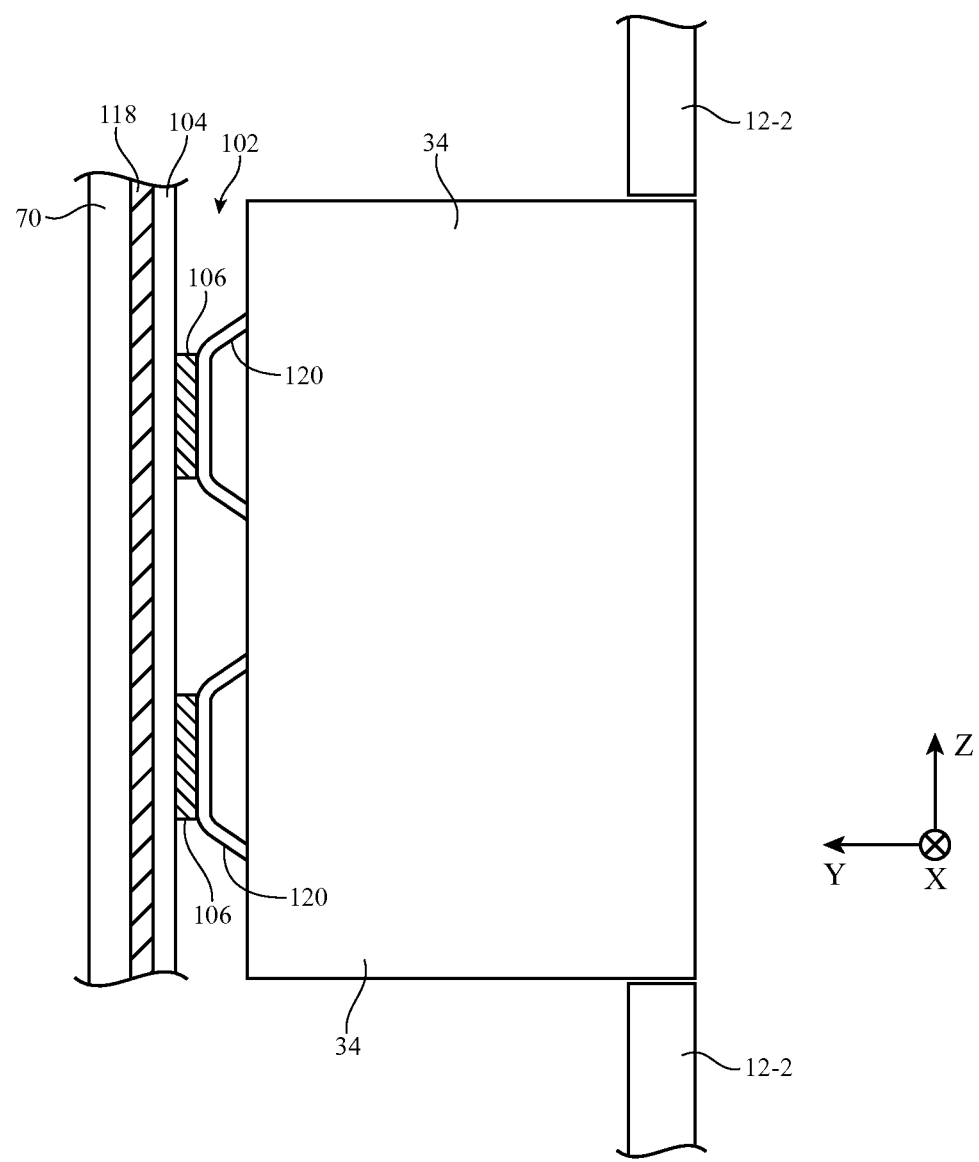
FIG. 25 is a cross-sectional side view of an illustrative component mounted in electrical contact with interconnects on a flexible interconnection substrate that has been mounted to a support structure in accordance with an embodiment.

Components 34 may be installed in openings 36 in housing wall 12-2 before or after printed circuit 102 is attached to support structure 70 and is inserted into the interior cavity defined by housing wall 12-2. With one suitable arrangement, components 34 are installed within openings 36 before support structure 70 is inserted into the cylindrical interior of housing 12. Each component 34 may have inwardly protruding contacts such as springs 120 of FIG. 25. The use of springs 120 in the example of FIG. 25 is merely illustrative. In general, components 34 may have terminals formed from spring-loaded pins, metal pads, spring structures, conductive foam, conductive foam covered with conductive fabric or metal foil, or other suitable compressible conductive structures that exhibit a restoring force when compressed. The restoring force helps hold adjoining contact surfaces together, thereby ensuring a satisfactory electrical connection will be made between mating contacts.

After mounting all of components 34 within housing wall 12-2 and after attaching printed circuit 102 to the outside of support structure 70 so that contacts 106 and other interconnect lines on printed circuit 102 face outwards towards terminals 120 of components 34, support structure 70 and printed circuit 102 may be mounted in the cylindrical interior of housing wall 12-2 (e.g., support structure 70 may be inserted into the interior of housing 12 by sliding support structure 70 into housing 12 along the longitudinal axis of housing 12 (i.e., the vertical dimension in the example of FIG. 19).

When the outwardly facing contacts 106 on printed circuit 102 are inserted into housing 12, contacts 106 will make electrical connections with inwardly facing contacts 120 on the array of components 34 in housing 12.

As shown in FIG. 25, each contact 120 may mate with a corresponding contact 106 on printed circuit 102. Substrate 104 of printed circuit 102 may be attached to the cylindrical outer surface of support structure 70 using a layer of adhesive 118. Printed circuit 102 may also be attached to support structure 70 using screws, welds, or other mechanisms. The use of adhesive 118 to attach printed circuit 102 is illustrative.

When contacts 106 mate with component contacts 120, signal traces 108 on printed circuit 102 will be electrically connected to components 34. A separate signal line may be associated with each contact 106, so that components 34 can be individually controlled by the control circuitry in device 10.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
  a housing having a curved housing wall with a housing wall opening;
  a flexible printed circuit attached to a curved inner surface of the curved housing wall, the flexible printed circuit comprising a flexible substrate defining a flexible printed circuit opening that is aligned with the housing wall opening, wherein the flexible printed circuit has metal traces that form signal lines and flexible printed circuit contacts; and
  an electrical component that is aligned within and extends through the flexible printed circuit opening and the housing wall opening, wherein the electrical component has terminals that mate with the flexible printed circuit contacts.

2. The electronic device defined in claim 1 further comprising a layer of adhesive that attaches the flexible printed circuit to the curved inner surface of the curved housing wall.

3. The electronic device defined in claim 2 wherein the housing wall opening comprises one of a plurality of housing wall openings in the housing wall and wherein the electrical component comprises one of a plurality of electrical components that are respectively aligned with the housing wall openings.

4. The electronic device defined in claim 3 wherein the curved housing wall is cylindrical.

5. The electronic device defined in claim 4 wherein the electrical components comprise components selected from the group consisting of: light sources, light detectors, speakers, and sensors.

6. The electronic device defined in claim 5 wherein the terminals comprise springs.

7. The electronic device defined in claim 5 wherein the flexible printed circuit comprises a cylindrical tube attached to the curved inner surface with the layer of adhesive.

8. An electronic device, comprising:
  a cylindrical housing having a housing wall defining a housing wall opening;
  an electrical component aligned with the housing wall opening and having terminals; and
  a flexible printed circuit, comprising:
    a flexible substrate defining a flexible circuit opening aligned with the housing wall opening, and
    contacts mated with the terminals,
  wherein the electrical component extends through the flexible circuit opening and into the housing wall opening.

9. The electronic device defined in claim 8, wherein the electrical component comprises a component selected from the group consisting of: a light source, a light detector, a speaker, and a sensor.

10. The electronic device defined in claim 8, further comprising a layer of adhesive that attaches the flexible printed circuit to an interior surface of the cylindrical housing.

11. The electronic device defined in claim 10 wherein the terminals comprise compressible conductive structures that are compressed against the contacts.

12. The electronic device defined in claim 11 wherein the housing wall opening comprises one of a plurality of housing wall openings in the housing wall and wherein the electrical component comprises one of a plurality of electrical components aligned with the housing wall openings.

13. An electronic device, comprising:
  a cylindrical housing defining a plurality of housing openings;
  a flexible printed circuit that contains metal traces that carry signals for the electrical components, the flexible printed circuit defining flexible printed circuit openings aligned with corresponding housing openings of the plurality of housing openings; and
  a plurality of electrical components, each electrical component extending through a housing opening of the plurality of housing openings and a corresponding one of the flexible printed circuit openings.

14. The electronic device defined in claim 13 wherein the electrical components comprise components selected from the group consisting of: light sources, light detectors, speakers, and sensors.

15. The electronic device defined in claim 14 further comprising a layer of adhesive that attaches the flexible printed circuit to an interior surface of the cylindrical housing.

* * * * *